(12) United States Patent
Bentley (10) Patent No.: US 6,567,254 B2
(45) Date of Patent: May 20, 2003

(54) METHODS AND SYSTEMS FOR REDUCING CLAMP VOLTAGES IN SURGE PROTECTION CIRCUITRY

(75) Inventor: Gregory L. Bentley, Wallace, ID (US)

(73) Assignee: Northern Technologies, Inc., Liberty Lake, WA (US)

( * ) Notice: Subject to any disclaimer, the term of this patent is extended or adjusted under 35 U.S.C. 154(b) by 0 days.

(21) Appl. No.: 09/812,760

(22) Filed: Mar. 20, 2001

(65) Prior Publication Data

US 2002/0159213 A1 Oct. 31, 2002

(51) Int. Cl.[7] .................................................. H02H 3/22
(52) U.S. Cl. ...................................................... 361/111
(58) Field of Search ........................ 361/54, 91.1, 91.5, 361/111, 119; 324/767; 327/589, 586

(56) References Cited

U.S. PATENT DOCUMENTS 4,763,069 A * 8/1988 Landrini ..................... 324/767
6,366,469 B1 * 4/2002 Odenberg et al. ........... 361/111

* cited by examiner

Primary Examiner—Ronald W. Leja
(74) Attorney, Agent, or Firm—Fish and Neave; Jeffrey Ingerman (57) ABSTRACT

Arrangements for a surge protection device reduce the effects of mutual inductance and therefore, the overall inductance in electrical connections between suppression components in the device. Suppression components in surge protection devices can be oriented such that current flow through adjacent diodes are opposite in direction, thereby causing induced magnetic fields to be opposite in direction to each other. As a result, overall inductances of the surge protection devices are decreased which in turn causes clamp voltages of the surge protection devices to be decreased. In addition, multi-layered circuit boards and integrated circuits can be used to implement surge protection devices so that inductive effects of electrical connections in the surge protection devices are decreased, in order to decrease clamp voltages.

8 Claims, 10 Drawing Sheets

METHODS AND SYSTEMS FOR REDUCING CLAMP VOLTAGES IN SURGE PROTECTION CIRCUITRY

BACKGROUND OF THE INVENTION

The invention relates to surge protection circuitry. More particularly, the invention relates to methods and systems for reducing clamp voltages in surge protection circuitry.

Electrical power surges can cause equipment failure. Surges can be transient in nature, and may be caused by events such as lightning strikes, short-circuited power lines, or power supply failure. Equipment failure results from failure of electrical circuits that are unable to handle high energy signals.

Transient, or surge protection devices protect equipment from failure by providing a path to ground for high energy signals, so that the high energy signals bypass downstream equipment. A common method of implementing a surge protection device is to provide a low resistance path to ground which is usually disconnected from downstream equipment to be protected but becomes connected to the downstream equipment when a high energy signal is sensed.

Conventional surge protection devices may include a suppression component such as a diode, coupled between a power supply and downstream equipment that is to be protected by a surge protection device. When the diode senses a high-energy electrical signal and if the voltage of the signal is above the threshold voltage, the diode starts conducting current to ground. The magnitude of voltage at which the signal causes the diode to conduct is called the clamp voltage and is equal to the sum of the threshold voltage of the diode and any voltage drop caused by impedance in any electrical connection of the diode. Ideally, the clamp voltage should be close to the diode threshold voltage because diode threshold voltages are generally well specified under a range of operating conditions, unlike electrical connection impedances. Impedance is unpredictable with respect to transient high energy signals because it is proportional to voltage switching frequencies which are unpredictable.

Surge protection devices are often implemented on printed circuit boards in order to minimize the size of the device, to automate production, and to reduce the cost of production. Printed circuit boards typically may include an insulating substrate to isolate components mounted thereon and copper traces on the substrate to connect components (e.g., integrated circuits). The copper traces connecting the components generate inductance when the traces conduct current. Typically, power supply signals to equipment, and to electrical circuits in general, is either of zero frequency— i.e., DC (Direct Current)—or of a fixed non-zero frequency—i.e., AC (Alternating Current)—. Therefore, when the suppression components in a surge protection device are not conducting current, the copper traces generate inductive reactances of small or zero magnitude.

However, during transient conditions, the electrical signals presented to surge protection devices are typically of higher frequencies. At higher frequencies, the trace inductance of the printed circuit board forms a larger portion of trace impedance, as impedance, Z, of an inductor is described by $Z=j\omega L$ (frequency, $\omega$; inductance, L). Therefore, it is desirable to reduce trace inductances, thereby decreasing clamp voltages of surge protection devices.

A typical surge protection device may include diodes connected in parallel that conduct in the event that high energy signals occur. In an effort to reduce the size of the overall surge protection device, more than one diode is often required to meet the specifications for the surge protection device. In a typical arrangement of parallel-connected diodes, electrical connections can contribute both self-inductance and mutual inductance to trace inductances.

Therefore, it is desirable to provide a method for connecting suppression components in surge protection devices such that the clamp voltages of the surge protection devices are reduced.

SUMMARY OF THE INVENTION

It is an object of the invention to provide a method for connecting suppression components in surge protection devices such that the clamp voltages of the surge protection devices are reduced. If overall inductance in a surge protection device is decreased, the clamp voltage of the surge protection device is reduced. The present invention provides a method for arranging suppression components such that overall inductance is decreased, by decreasing mutual inductance. The orientation of suppression components can be manipulated such that when the suppression components conduct, the current flow of neighboring suppression components can be in opposite directions. The direction of current flow affects the direction of any magnetic field induced by the current flow, and hence any mutual inductance caused by the current flow. Additive effects of mutual inductance may thus be reduced by changing the orientation of the suppression components. A reduction in overall inductance follows any reduction in mutual inductance, and thus, a method is provided for decreasing the clamp voltage of a surge protection device.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Surge protection devices typically include suppression components such as diodes (e.g., silicon avalanche diodes and bipolar diodes), gas tubes, and metal oxide varistors, coupled together in parallel on printed circuit boards. In a typical surge protection device on a printed circuit board, the total inductance of a length of current-carrying conductor includes both mutual inductance and self-inductance. A printed circuit board trace is a current-carrying conductor which induces a magnetic field, with a density given by the Biot-Savart law, $$dB = \frac{\mu_0 id\vec{l} \times \vec{i}_r}{4\pi R_2}.$$

The inductance of the current-carrying conductor is the ratio of the magnetic field density to the current in the current-carrying conductor, H=B/i.

The mutual inductance of a current-carrying conductor is proportional to the sum of magnetic fields induced by other current-carrying conductors around it. The magnetic fields will be additive in inductive effect if they are in the same direction. Therefore, in order to reduce the inductive effects of the magnetic fields, it is necessary to change the direction of some of the magnetic fields such that those magnetic fields are in the opposite direction to other fields.

One way to achieve a change in direction of one magnetic field with respect to another, is to change the direction of current that induces that magnetic field with respect to current that induces another magnetic field. In the case of current-carrying conductors that connect suppression components to other parts of the circuit, a change in direction of current can be achieved by changing the orientation of some suppression components with respect to other suppression components while keeping the suppression components connected in parallel between a power supply and downstream devices to be protected.

If the orientation of some suppression components is changed with respect to other suppression components in a surge protection device, some arrangements of electrical connections of the suppression components may add to the overall inductance of the device, thereby reducing any decrease in the overall inductance gained by the new orientation of the suppression components. A first suppression component is preferably arranged such that current flows in a first direction with respect to an axis through the anode and cathode of the first suppression component. A second suppression component, which is adjacent to the first suppression component, is preferably arranged such that current flows in a second direction opposite to the first direction with respect to an axis through the anode and cathode of the second suppression component.

A first electrical connection can be made to connect the anodes of both suppression components, in addition to a second electrical connection which can be made to connect the cathodes of both suppression components. These electrical connections can be of sufficient thickness and length to cause significant additions to the overall inductance of a surge protection device that includes both suppression components.

Printed circuit boards can include multiple layers with conductive traces, sandwiched between isolation layers. In one embodiment of the invention, suppression components in a surge protection device may be oriented such that overall inductance is lowered, but still be substantially connected on one layer of a printed circuit board. This may be achieved by using a second layer of the printed circuit board as minimally as possible. The second layer may be used mainly to avoid shorting of conductive traces that form the electrical connections of the suppression components. In other embodiments of the present invention, the electrical connections of the suppression components in a surge protection device can be routed with conductive traces on multiple layers of the printed circuit board.

In one embodiment of the present invention, a surge protection device constructed in accordance with the present invention can include four diodes that are preferably lying substantially on one plane, wherein a set of first axes can be defined from the anode to the cathode of each diode. The diodes are preferably aligned such that the first axes are substantially parallel to each other.

Each diode may be oriented with respect to the set of first axes, such that when current flows through each diode, current flow along the first axis of each diode is in substantially the opposite direction of current flow along the first axes of adjacent diodes. In addition, a second axis can also be defined which is substantially perpendicular to the set of first axes. The diodes are also preferably aligned such that each diode substantially intersects with the second axis. In accordance with the principles of the present invention, a first pair of diodes, which are oriented in a first direction, is preferably connected on a first layer of the printed circuit board while a second pair of diodes, which are oriented in a second direction, is connected in parallel on a second layer.

In addition, in order that all diodes stay connected to each other in parallel, there is preferably a joining of the electrical connections on the first and second layers such that the anodes of the first pair of diodes are connected together to a first terminal of a power supply together with the anodes of the second pair of diodes. Furthermore, the cathodes of the first pair of diodes are preferably connected to the cathodes of the second pair of diodes and to a second terminal of the power supply. The joining of the anodes of the diodes, for example, can be achieved by coupling the electrical connections of the anodes, with vias, in at least one position on the printed circuit board where the electrical connections are in substantially the same position on the first and second layers. This arrangement of the diodes can reduce the overall inductance of the surge protection device due to opposing magnetic fields induced when currents flow in the diodes, without adding substantially to the overall inductance through the arrangement of the electrical connections.

Suppression components arranged in surge protection devices according to the principles of the invention can be connected either on the top or bottom of a printed circuit board. In other embodiments of the present invention, the suppression components may be positioned on a printed circuit board such that there are more than two suppression components adjacent to a suppression component. In these embodiments of the present invention, it may not be possible to adjust the orientation of all adjacent suppression components such that the magnetic fields induced by current flowing in the adjacent suppression components are opposite in direction to the magnetic field caused by adjacent suppression components. Calculations can be made to find out what the orientation of the adjacent suppression components should be such that overall inductance of electrical connections that couple all the suppression components together is preferably as low as possible.

Any calculation for the lowest overall inductance may take into account that the suppression component with the lowest clamp voltage will start conducting first in the event of a high energy signal. As it is desirable to have all suppression components in a surge protection device conducting in the event of a high energy signal in order to prevent a current overload on anyone suppression component, calculations for the lowest overall inductance can be balanced with consideration for keeping clamp voltages of each suppression component relatively equal.

Other embodiments of the present invention can include surge protection devices that are implemented as an integrated circuit, rather than discrete suppression components implemented on a printed circuit board. If a surge protection device is implemented as an integrated circuit, suppression elements of the device can be electrically connected on different layers of the integrated circuit in accordance with the principles of the present invention.

Figure 1:
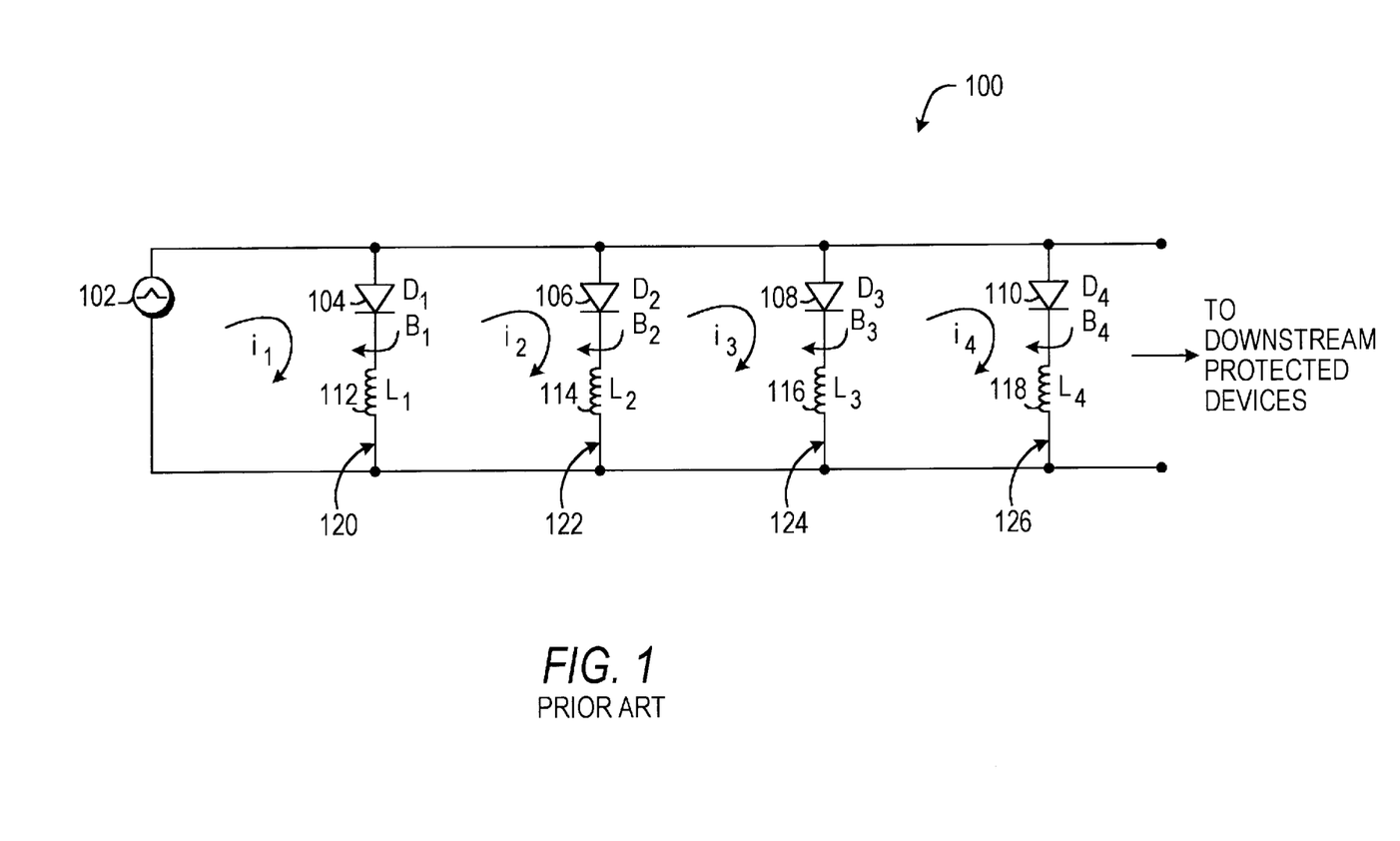
FIG. 1 is a diagram of a typical surge protection device.

FIG. 1 shows a typical embodiment of a surge protection device 100 that includes parallel-connected diodes 104, 106, 108, and 110 ($D_1$, $D_2$, $D_3$, and $D_4$) coupled between power supply 102 and downstream protected devices. Each of diodes 104, 106, 108, and 110 is substantially coupled to segments 120, 122, 124, and 126 respectively. Clamp voltage associated with each of diodes 104, 106, 108, and 110, can be defined as the total voltage drop across each of segments 120, 122, 124, and 126 respectively.

FIG. 1 also shows inductors 112, 114, 116, and 118 ($L_1$, $L_2$, $L_3$, and $L_4$) which symbolize the total inductance of each of segments 120, 122, 124, and 126 respectively. Inductor 112, can be expressed as the sum of its mutual and self-inductances such that $L_1 = L_{11} + L_{12} + L_{13} + L_{14}$ where $L_{jk}$ is the inductance caused by current $i_k$ flowing in a segment coupled to diode $D_j$. Furthermore, the underlying magnetic fields $B_1$, $B_2$, $B_3$, and $B_4$, induced by current $i_1$, $i_2$, $i_3$, and $i_4$ respectively, that cause inductors $L_{11}$, $L_{12}$, $L_{13}$, and $L_{14}$, respectively, are in the general directions shown in FIG. 1 (using the right-hand convention).

It can be seen from FIG. 1, that the self- and mutual inductances $L_{11}$, $L_{12}$, $L_{13}$, and $L_{14}$, are additive in nature. Similarly, inductors 114, 116, and 118 include mutual and self-inductances which are additive in nature.

Figure 2:
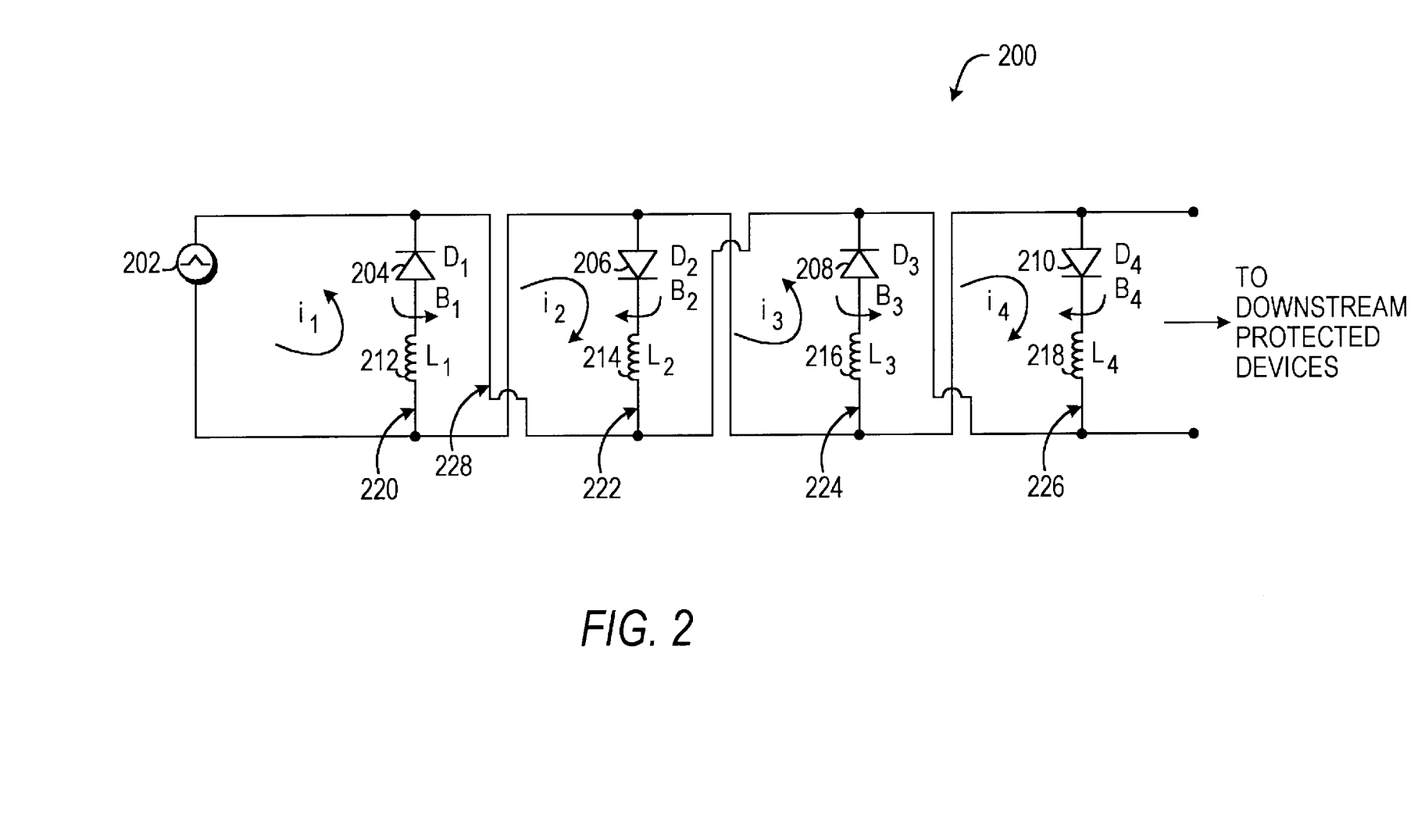
FIG. 2 is a diagram of a surge protection device.

FIG. 2 shows an embodiment of the present invention that includes parallel-connected diodes 204, 206, 208, and 210 ($D_1$, $D_2$, $D_3$, and $D_4$) coupled between power supply and downstream protected devices. Each of diodes 204, 206, 208, and 210 is substantially coupled to segments 220, 222, 224, and 226 respectively. Clamp voltage associated with each of diodes 204, 206, 208, and 210, can be defined as the total voltage drop across each of segments 220, 222, 224, and 226 respectively.

One difference between surge protection device 100 and surge protection device 200 is the difference between the topological arrangements of diodes $D_1$, $D_2$, $D_3$, and $D_4$. Segments 222, 224, and 226 are arranged such that current flow through $D_1$, $D_2$, $D_3$, and $D_4$ alternate in direction. Although surge protection device 100 is the electrical equivalent of surge protection device 200, the resulting inductances $L_1$, $L_2$, $L_3$, and $L_4$ are different.

FIG. 2 also shows total inductance of each segment symbolized by inductors 212, 214, 216, and 218 ($L_1$, $L_2$, $L_3$, and $L_4$) respectively. Inductance 212, $L_1$, of a segment coupled to $D_1$ can be expressed as the sum of its mutual and self-inductances such that $L_1 = L_{11} + L_{12} + L_{13} + L_{14}$ where $L_{jk}$ is the inductance caused by current $i_k$ in current-carrying conductor coupled to diode $D_j$. Furthermore, the underlying magnetic fields $B_1$, $B_2$, $B_3$, and $B_4$ related to the inductances $L_{11}$, $L_{12}$, $L_{13}$, and $L_{14}$, respectively are in the general directions shown in FIG. 2 (using the right-hand convention).

The resulting inductance of $L_1$ from FIG. 2 is different from inductance of $L_1$ in FIG. 1 because the underlying magnetic fields $B_1$, $B_2$, $B_3$, and $B_4$ alternate in direction, thereby reducing additive effects of mutual inductance on $L_1$. Similarly, $L_2$, $L_3$, and $L_4$ exhibit lowered inductances due to the reduced additive effects of mutual inductance.

When voltage source 202 produces a high-energy electrical signal with voltage level above the threshold voltage of diode 204, surge protection device 200 starts conducting, thereby protecting downstream devices. The clamp voltage for surge protection device 200 is smaller and closer in value to threshold voltages of diodes 204, 206, 208, and 210 than in the case of surge protection device 100 because inductances caused by segments 220, 222, 224, and 226 are lower than segments 120, 122, 124, and 126.

However, surge protection device 200 can have additional overall inductance because of additional lengths of conductor required connecting the diodes. In addition, FIG. 2 shows segment 228 that has current flowing ($i_2$) in the same direction as $i_1$, thereby generating a magnetic field in the same direction as $B_1$, which is associated with inductor 212 ($L_1$). Although the orientation of diodes 204, 206, 208, and 210 can cancel some of the additive effects of mutual inductance when current flows in the diodes, current flowing in segments such as segment 228, can add mutual inductance.

Multiple layers of either a printed circuit or an integrated circuit can be used to provide arrangements of surge protection devices that do not add mutual inductance to the surge protection devices in the manner of surge protection device 200. In one embodiment of the present invention, shown in FIG. 3, surge protection device 300 is implemented on a printed circuit board with at least two layers with conductive traces. It can be seen that the electrical connections for surge protection device 300 are equivalent, but topologically different from connections for surge protection device 200.

Surge protection device 200 and surge protection device 300 differ in the topology of their respective electrical connections for diodes 306 and 310, as opposed to diodes 206 and 210. The anodes and cathodes of diodes 306 and 310 are substantially coupled to terminals of power supply 302 via a different layer of the printed circuit board from diodes 304 and 308. Solid lines that form electrical connections in FIG. 3 indicate connections on a first layer of the printed circuit board while dotted line 328 indicates connections on a second layer of the printed circuit board. This topology does not require formation of segments such as segment 228 in FIG. 2 to connect the diodes and therefore avoids potential additive inductive effects of segments such as segment 228.

Figure 3:
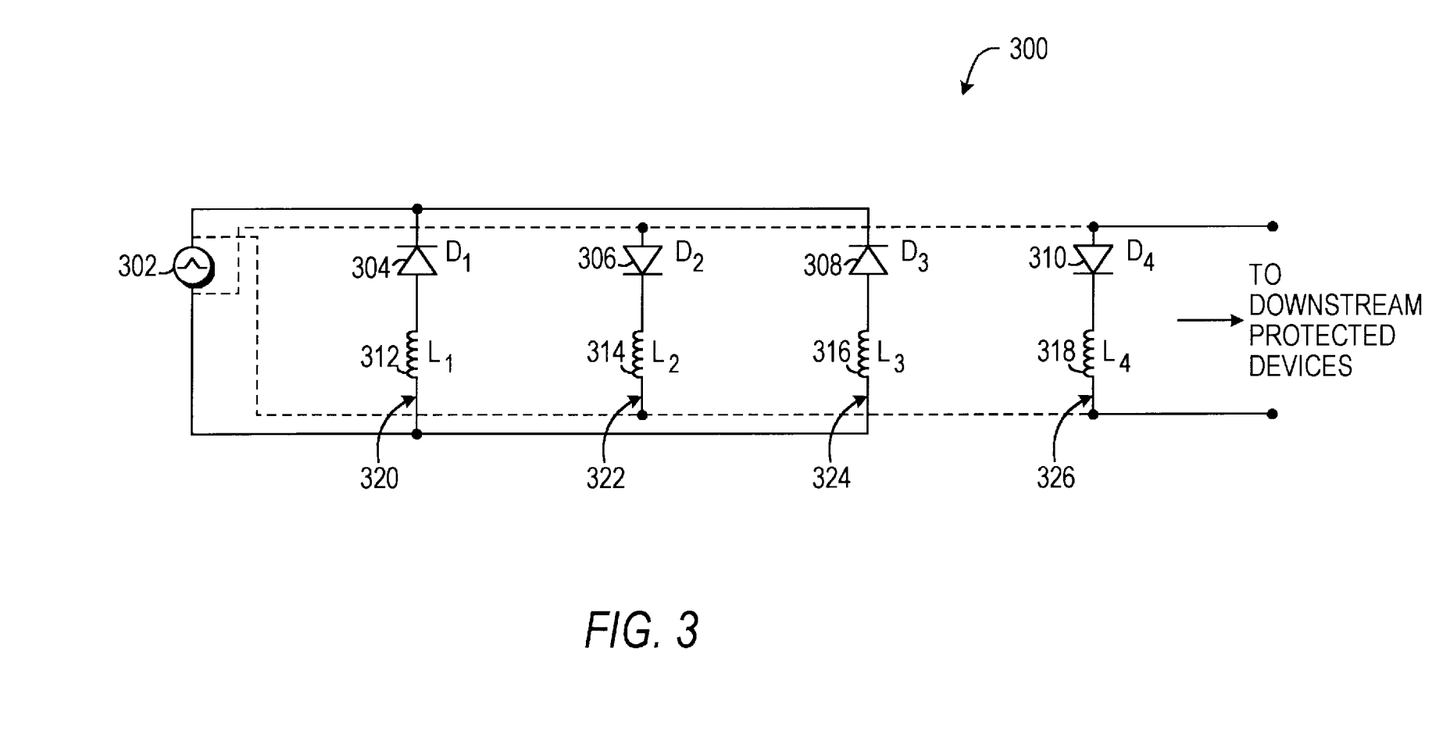
FIG. 3 is a diagram of a surge protection device.

When voltage source 302 produces a high-energy electrical signal and if the voltage of the signal is above the threshold voltage of any of diodes 304, 306, 308, and 310, surge protection device 300 starts conducting in order to protect downstream devices. The clamp voltage for surge protection device 300 is smaller and closer in value to threshold voltages of diodes 304, 306, 308, and 310 than in the case of surge protection device 200 because segments such as segment 228 of surge protection device 200 do not exist in surge protection device 300.

Figure 4:
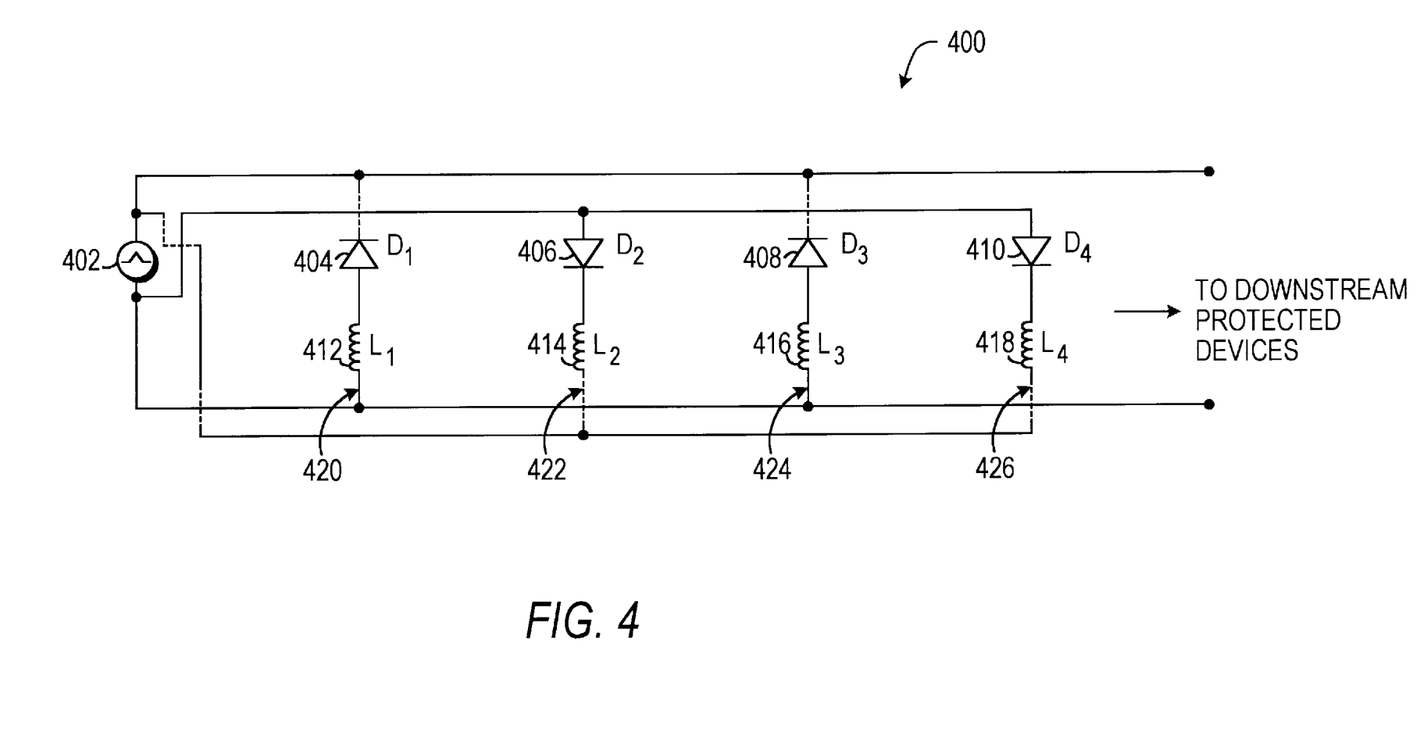
FIG. 4 is a diagram of a surge protection device.

Another embodiment of the present invention is shown in FIG. 4. FIG. 4 shows diodes 404, 406, 408, and 410 that are connected in parallel with power supply 402 and downstream devices to be protected. Unlike FIG. 3, electrical connections for surge protection device 400 are mostly implemented with conductive traces on one layer of a printed circuit board or integrated circuit. Dotted lines in FIG. 4 indicate usage of another layer of the printed circuit board to connect the anodes of the diodes together, and the cathodes of the diodes together.

FIGS. 1–4 show surge protection devices with suppression components that are substantially parallel to each other with respect to a set of first axes defined from anodes to cathodes of the components. In addition, the components substantially intersect with a second axis that is substantially perpendicular to the set of first axes. The present invention also provides methods for decreasing clamp voltages in surge protection devices in which suppression components are not aligned as shown in FIGS. 1–4.

Figure 5:
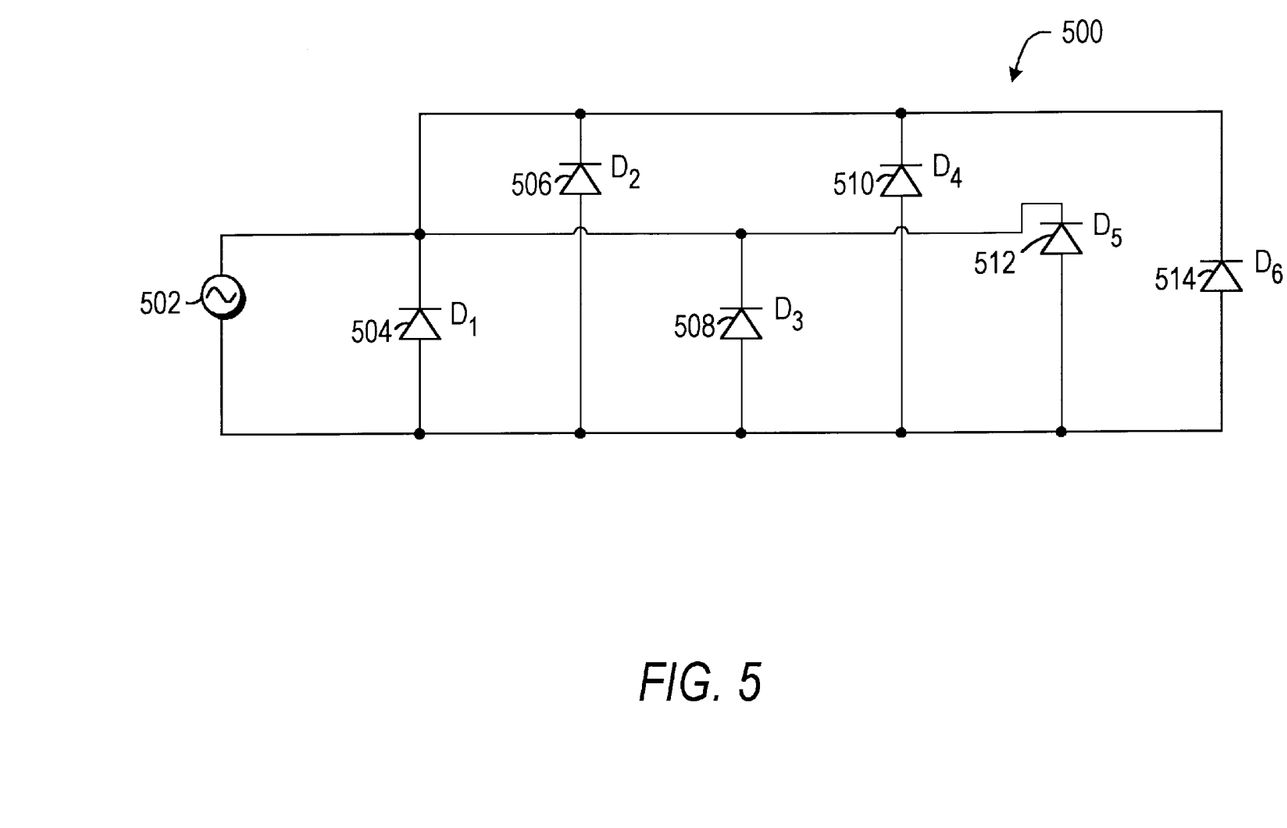
FIG. 5 is a diagram of a surge protection device.

FIG. 5 shows device 500 that includes diodes 504, 506, 508, 510, 512, 514 connected in parallel with power supply 502. Diodes 504, 506, 508, 510, 512, 514 are not aligned in a similar manner to the diodes shown in FIGS. 1–4. Surge protection device 500 includes diodes 504, 506, 508, 510, 512, 514 connected in parallel with power supply 502. For example, not all of diodes 504, 506, 508, 510, 512, 514 intersect substantially with respect to a second axis which is perpendicular to a first set of axes that run from the anodes to the cathodes of the diodes. This causes diode 510, for example, to arguably have three adjacent diodes, diode 508, diode 506, and diode 512.

In order to reduce overall inductance of surge protection device 500 in the event that the respective positions of diodes 504, 506, 510, 512, and 514 cannot be changed, it may be necessary to calculate the overall inductance based on several possible surge protection device arrangements. In accordance with the principles of the present invention, an arrangement of suppression components may be used that has the lowest overall inductance.

Figure 6:
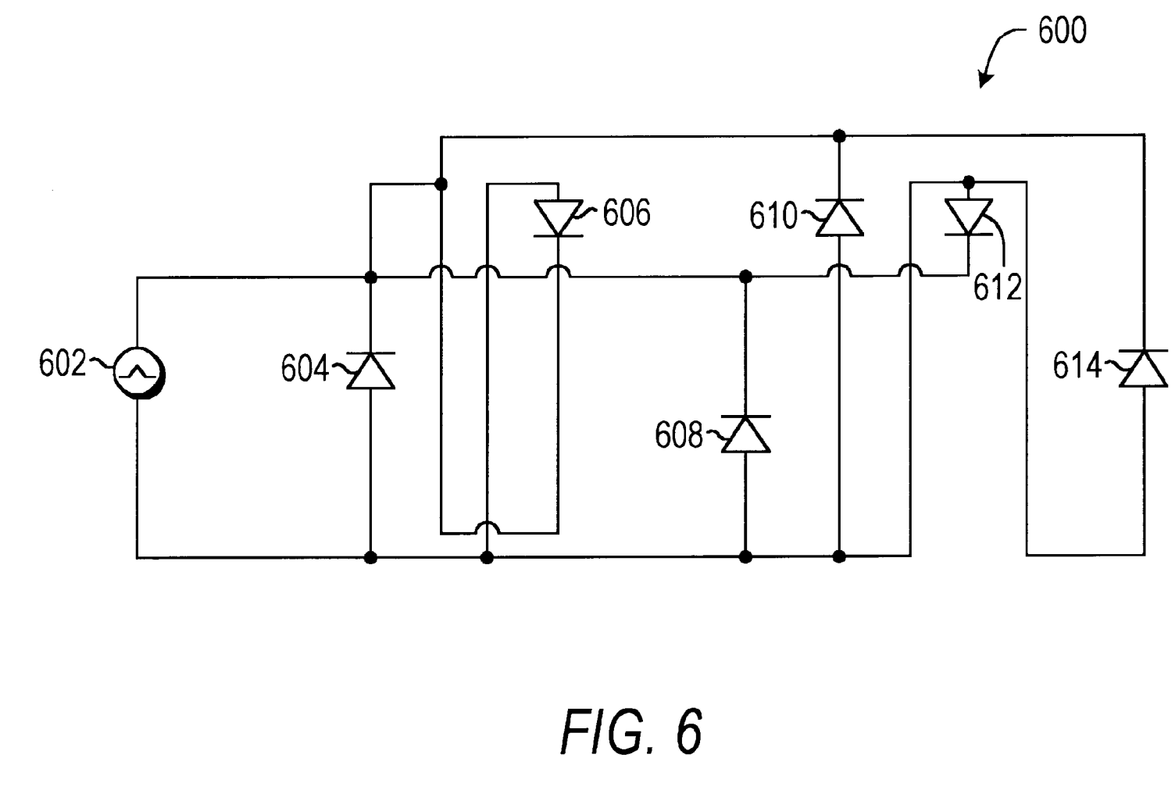
FIG. 6 is a diagram of a surge protection device.

FIG. 6 shows an arrangement of diodes 604, 606, 608, 610, 612, and 614 which are arranged in an electrically equivalent manner to diodes 504, 506, 508, 510, 512, and 514. In accordance with the principles of the present invention, each diode can be oriented such that mutual inductance caused by magnetic fields induced by current flow through each diode is reduced. With respect to diode 610 which arguably has three adjacent diodes, one of the three adjacent diodes, diode 608, may have the same orientation as diode 610 if calculations show that this orientation results in a lower overall inductance for surge protection device 600.

To further reduce overall inductance, conducting segments coupled to diodes 604, 606, 608, 610, 612, and 614 may be formed on multiple layers of a printed circuit board or an integrated circuit, in a similar manner to surge protection device 300 in FIG. 3.

Figure 7A:
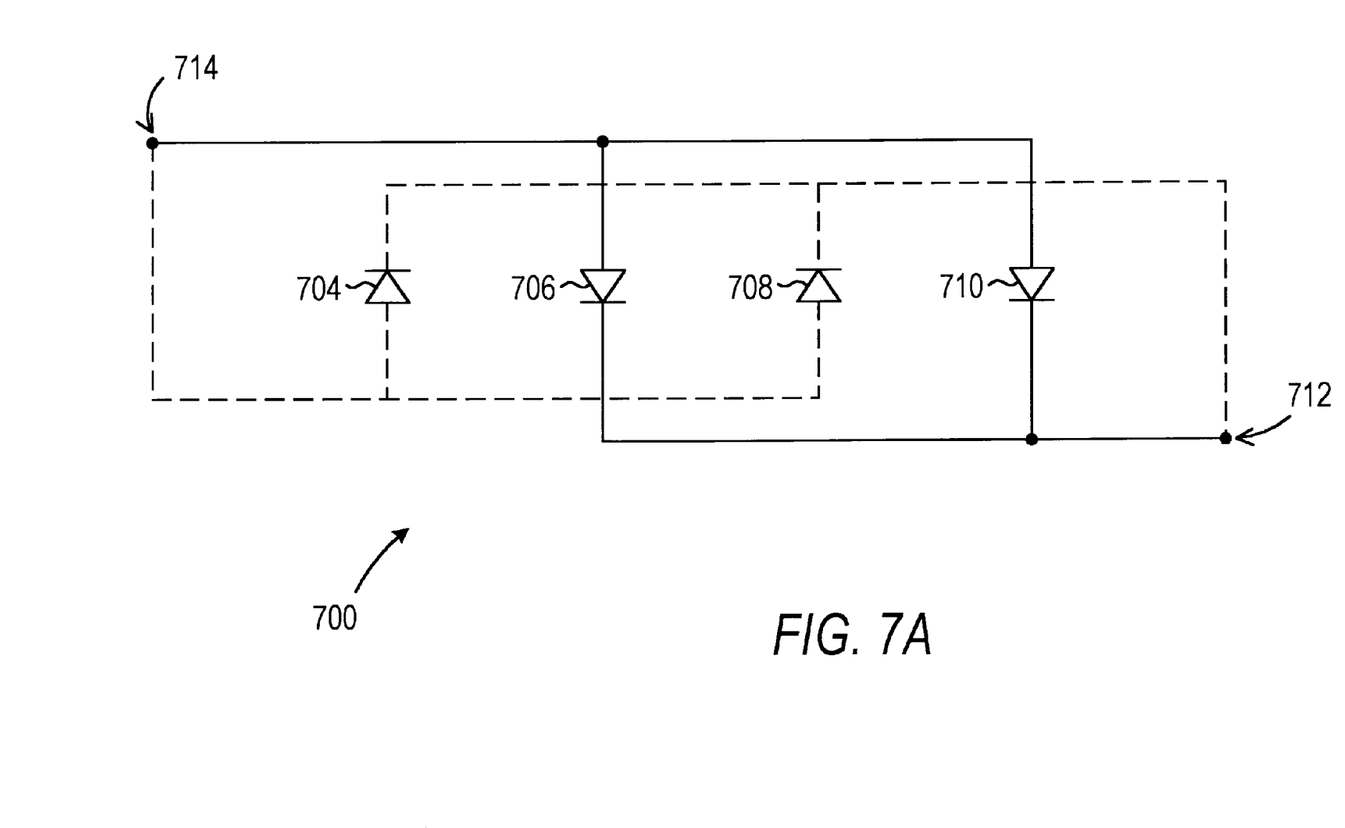
FIG. 7A is a diagram of a surge protection device.

FIG. 7A shows surge protection device 700 which includes diodes 704, 706, 708, and 710, that are coupled together in parallel on a printed circuit board. Dotted lines connecting the diodes indicate electrical connections formed on a first layer of the printed circuit board, while solid lines connecting the diodes indicate electrical connections formed on a second layer of the board. In this embodiment of this invention, cathodes of the diodes are connected at node 714, while anodes of the diodes are connected at node 712. Terminals of a power supply can be connected to surge protection device 700, at nodes 712 and 714 in accordance with this embodiment of the invention, in a manner different from that shown in FIGS. 1–6.

Figure 7B:
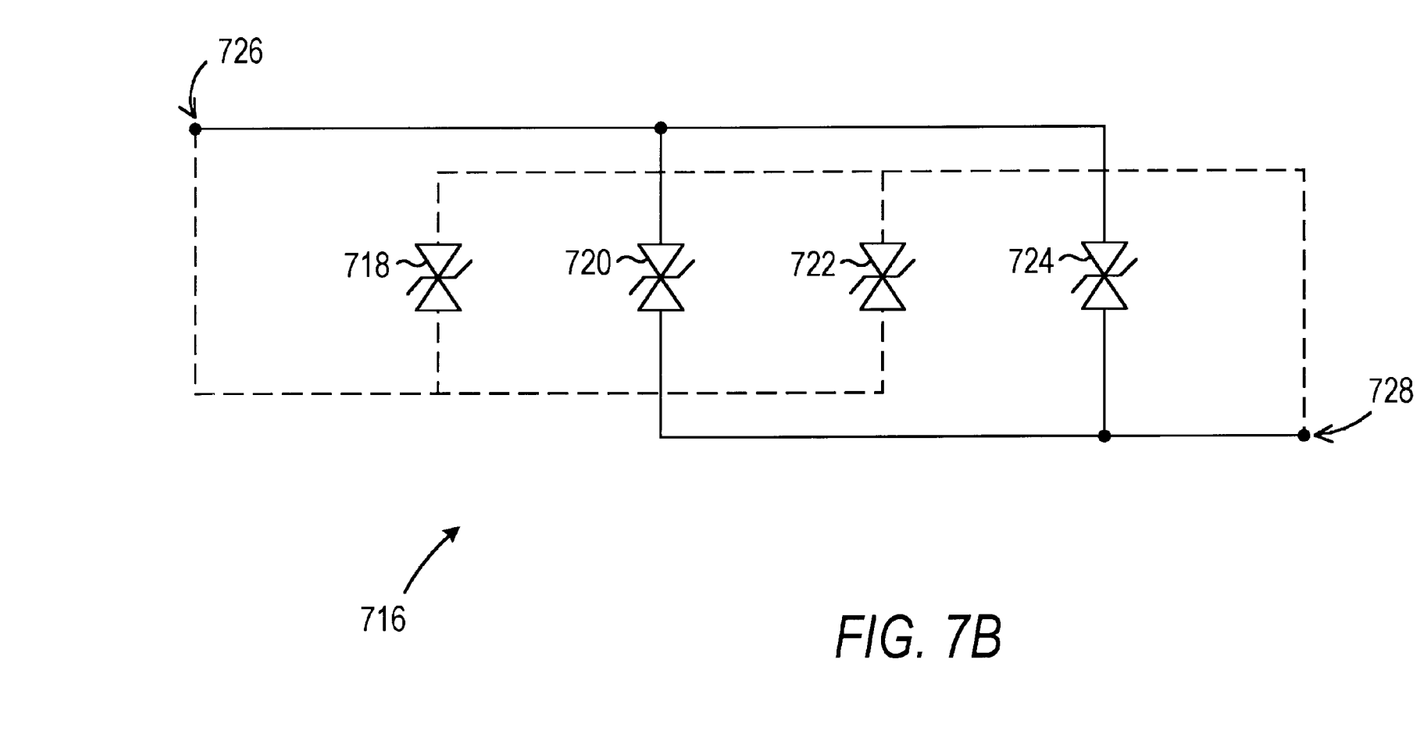
FIG. 7B is a diagram of a surge protection device.

FIG. 7B shows surge protection device 716 that includes bipolar diodes 718, 720, 722, and 724 which are coupled together in parallel on a printed circuit board. Bipolar diodes conduct current if a signal applied to the bipolar diodes has a voltage level above a first threshold voltage, and if a signal applied to the bipolar diodes has a voltage below a second threshold voltage. Surge protection device 716 has effectively two clamp voltages, which can both be reduced in magnitude according to the principles of the present invention. Whatever the direction of current flow in any of bipolar diodes 718, 720, 722, and 724, the current flow in adjacent diodes will be of the opposite direction such that clamp voltages are reduced due to reduced mutual inductance.

FIG. 7B also shows dotted lines connecting the bipolar diodes that indicate electrical connections formed on a first layer, or a first side, of the printed circuit board, while solid lines connecting the diodes indicate electrical connections formed on a second layer, or a second side, of the board. In this embodiment of this invention, a first terminal of the bipolar diodes is connected at node 726, while a second terminal of the diodes is connected at node 728. Terminals of a power supply can be connected to surge protection device 716, at nodes 726 and 728 in accordance with this embodiment of the invention, in a manner different from that shown in FIGS. 1–6.

Figure 8:
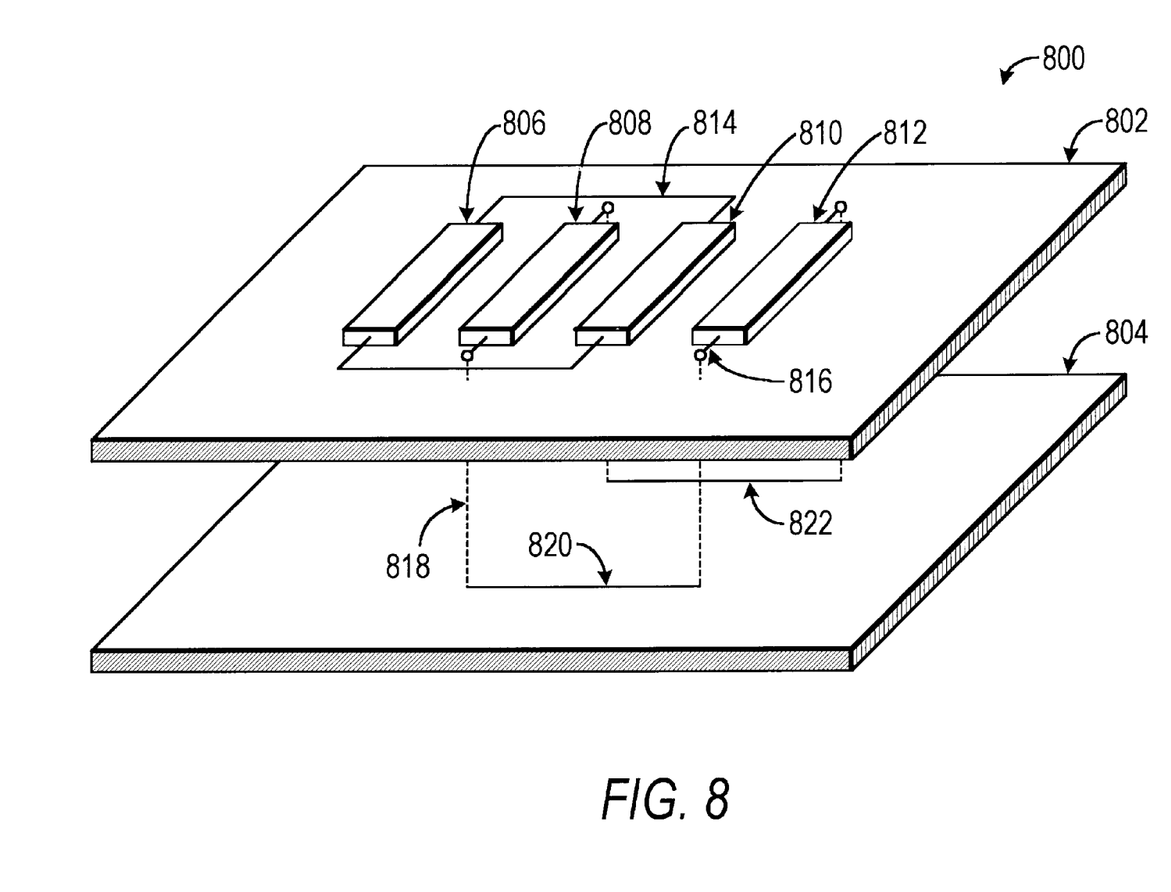
FIG. 8 is a diagram of a surge protection device implemented on a printed circuit board.

FIG. 8 is a possible printed circuit board arrangement of the electrical connections of diodes 304, 306, 308, and 310 of surge protection device 300 in FIG. 3. FIG. 8 shows surge protection device 800 which is implemented on a printed circuit board which includes two layers with conductive traces, layer 802 and layer 804. Suppression components 806, 808, 810, and 812 are electrically connected in parallel. Suppression components 806 and 810 are connected with a first set of traces to layer 802, with segments such as segment 814, while suppression components 808 and 812 are substantially connected with a second set of traces on layer 804, with segments such as segment 816, 818, 820, and 822, connecting components 808 and 812 to traces on layer 804.

Figure 9:
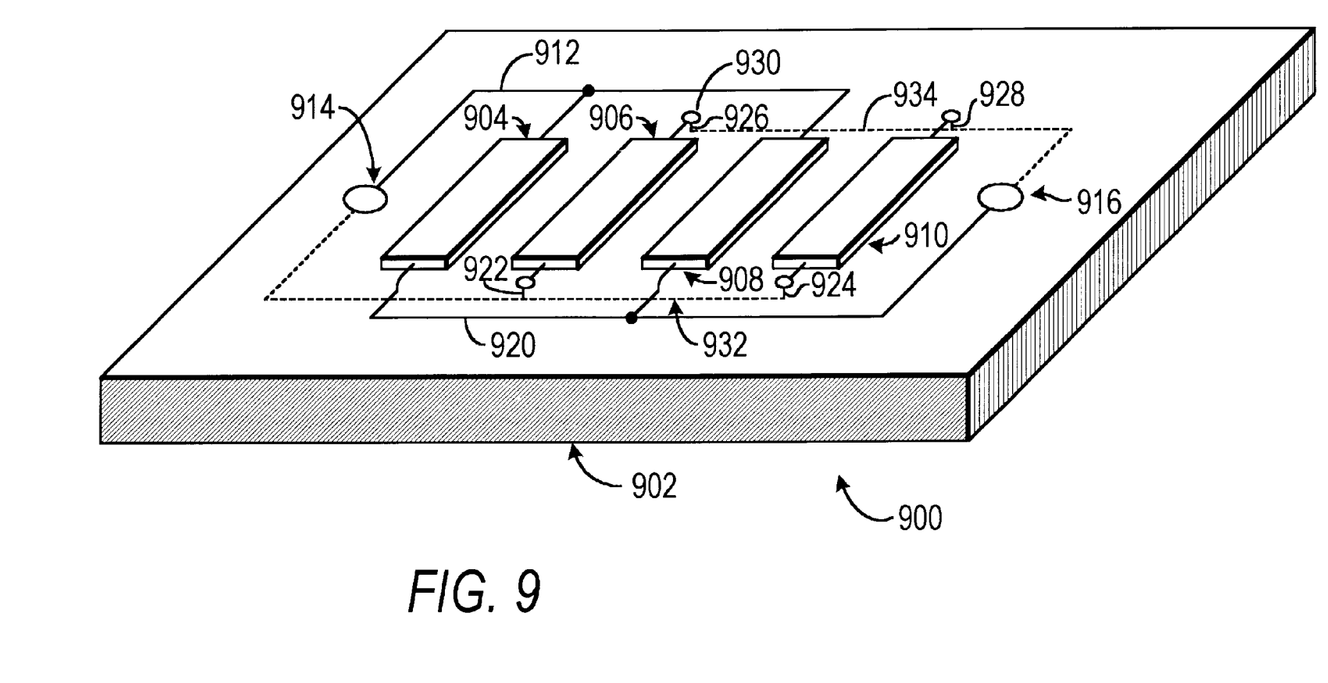
FIG. 9 is a diagram of a surge protection device implemented on a printed circuit board.

FIG. 9 is a possible printed circuit board arrangement of the electrical connections of diodes 704, 706, 708, and 710 of surge protection device 700 in FIG. 7A as well as diodes 718, 720, 722, and 724 in FIG. 7B. FIG. 9 shows surge protection device 900 which is implemented on a printed circuit board 902 which includes conductive traces on a first and second side of printed circuit board 902. Suppression components 904, 906, 908, and 910 are electrically connected in parallel. Suppression components 904 and 908 are connected with a first set of traces on the first side printed circuit board 902. Traces, such as traces 912 and 920, which are on the top of printed circuit board 902, are indicated with solid lines in FIG. 9. Suppression components 906 and 910 are connected with a second set of traces on the second side of printed circuit board 902. Traces, such as traces 932 and 934, which are on the second side of printed circuit board 902, are indicated with dotted lines in FIG. 9. Vias, such as via 930, allow suppression components 906 and 910 to be connected to traces on the second side of printed circuit board 902. Anodes and cathodes of suppression components 904, 906, 908, and 910 can be connected together to terminals of a power supply at mounting terminals 914 and 916 in accordance with this embodiment of the invention.

Thus it is seen that suppression components can be connected and arranged in surge protection devices on printed circuit boards such that the resulting impedance is lowered and clamp voltages reduced. One skilled in the art will appreciate that the present invention can be practiced by other than the described embodiments, which are presented for purposes of illustration and not of limitation, and the present invention is limited only by the claims which follow.

I claim:

1. A method of decreasing clamp voltage in a surge protection device, the surge protection device comprising at least two suppression components, wherein each suppression component comprises a cathode and an anode, coupled to an upstream power supply and downstream devices to be protected, the method comprising:

coupling the suppression components such that the suppression components are electrically in parallel wherein the cathodes are electrically coupled together and the anodes are electrically coupled together;

coupling the suppression components such that a first axis through the anode and cathode of each suppression component is substantially parallel to the first axes of other suppression components;

orienting each suppression component such that when current flows in each suppression component, the current flow in each suppression component is in a substantially opposite direction to the current flow in any adjacent suppression component; and aligning each suppression component such that each suppression component substantially intersects a second axis substantially perpendicular to the set of first axes.

2. The method of claim 1, wherein the surge protection device is implemented as a circuit on a printed circuit board, wherein the printed circuit board comprises multiple layers.

3. The method of claim 2 further comprising:

coupling the suppression components together such that when current flows through the suppression components, the suppression components that have current flowing in a first direction, are substantially connected together with conductive traces on a first layer of the printed circuit board; and coupling the suppression components together such that when current flows through the suppression components, the suppression components that have current flowing in a second direction, are substantially connected together with conductive traces on a second layer of the printed circuit board.

4. The method of claim 1 further comprising:

coupling the suppression components together such that when current flows through the suppression components, the suppression components that have current flowing in a first direction, are substantially connected together with conductive traces on a first side of a printed circuit board; and coupling the suppression components together such that when current flows through the suppression components, the suppression components that have current flowing in a second direction, are substantially connected together with conductive traces on a second side of the printed circuit board.

5. A surge protection device configured to have decreased clamp voltage, the device comprising at least two suppression components, wherein each suppression component comprises a cathode and an anode, coupled to an upstream power supply and downstream devices to be protected, wherein the suppression components are:

(i) electrically coupled in parallel wherein the cathodes are electrically coupled together and the anodes are electrically coupled together;

(ii) coupled such that a first axis through the anode and cathode of each suppression component is substantially parallel to the first axes of all the suppression components;

(iii) oriented such that when current flows in each suppression component, the current flow in each suppression component is in a substantially opposite direction to the direction of current flow in adjacent suppression components; and (iv) aligned such that each suppression component substantially intersects a second axis substantially perpendicular to the set of first axes.

6. The surge protection device of claim 5, wherein the surge protection device is implemented as a circuit on a printed circuit board, wherein the printed circuit board comprises multiple layers.

7. The surge protection device of claim 6, wherein the suppression components are:

(i) coupled such that when current flows through the suppression components, the suppression components that have current flowing in a first direction, are substantially connected together with conductive traces on a first layer of the printed circuit board; and (ii) coupled such that when current flows through the suppression components, the suppression components that have current flowing in a second direction, are substantially connected together with conductive traces on a second layer of the printed circuit board.

8. The surge protection device of claim 5, the suppression components are:

(i) coupled such that when current flows through the suppression components, the suppression components that have current flowing in a first direction, are substantially connected together with conductive traces on a first side of the printed circuit board; and (ii) coupled such that when current flows through the suppression components, the suppression components that have current flowing in a second direction, are substantially connected together with conductive traces on a second side of the printed circuit board.

* * * * *